United States Patent [19]

Azmanov

[11] Patent Number: 5,494,842
[45] Date of Patent: Feb. 27, 1996

[54] METHOD OF PROGRAMMING A CMOS READ ONLY MEMORY AT THE SECOND METAL LAYER IN A TWO-METAL PROCESS

[75] Inventor: Ziv Azmanov, Hadera, Israel

[73] Assignee: National Semiconductor Corporation, Santa Clara, Calif.

[21] Appl. No.: 426,356

[22] Filed: Apr. 21, 1995

Related U.S. Application Data

[62] Division of Ser. No. 337,793, Nov. 14, 1994.

[51] Int. Cl.[6] .............................................. H01L 21/8246
[52] U.S. Cl. .............................................. 437/52; 437/195
[58] Field of Search .............................. 437/48, 52, 195; 257/390

[56] References Cited

U.S. PATENT DOCUMENTS

| | | |
|---|---|---|
| 4,326,329 | 4/1982 | McElroy . |
| 4,384,399 | 5/1983 | Kuo . |
| 4,390,971 | 6/1983 | Kuo ........................................ 365/104 |

FOREIGN PATENT DOCUMENTS

| | | | |
|---|---|---|---|
| 0190928 | 8/1986 | European Pat. Off. .............. | 257/390 |

*Primary Examiner*—Tom Thomas
*Attorney, Agent, or Firm*—Skjerven, Morrill, MacPherson, Franklin & Friel; Ken John Koestner

[57] ABSTRACT

A CMOS ROM is fabricated and programmed using a two-metal fabrication process which is substantially equivalent to a conventional CMOS polysilicon gate manufacturing technique so that the CMOS ROM is advantageously fabricated in the same process steps that are used to fabricate the other, non-ROM circuits on an integrated circuit chip. In this method, multiple bit-lines in a first metal layer are formed which overlie a substrate containing the array of transistors. The bit-lines are connected to drain regions of the transistors. A dielectric insulating layer is formed over the substrate and the bit-lines and the dielectric insulating layer is perforated by vias which allow connecting to the first metal layer. Multiple word-lines and multiple reference voltage lines are formed in a second metal layer overlying the dielectric insulating layer. Either a word-line or a reference voltage line is programmably selected to connect to the gate of a transistor for each transistor of the multiple transistors.

6 Claims, 11 Drawing Sheets

5,494,842

METHOD OF PROGRAMMING A CMOS READ ONLY MEMORY AT THE SECOND METAL LAYER IN A TWO-METAL PROCESS

This application is a division of application Ser. No. 08/337,793, filed Nov. 14, 1994.

BACKGROUND OF THE INVENTION

1. Field of the Invention

The present invention relates to a semiconductor ROM memory device and corresponding fabrication method and, more particularly, to a two layer metal CMOS ROM in which programming is accomplished upon deposition of the second metal layer.

2. Description of the Related Art

Semiconductor memory devices are widely used in digital systems including minicomputers, microprocessors, microcontrollers and computing systems. Storage of fixed programs is often furnished in these systems using MOS read only memory devices, called ROMs. ROMs are fabricated by semiconductor manufacturers by special order, in which the program code fixed into the ROM is specified by the customer. The manufacturing process is lengthy, requiring many steps, with the steps extracting a cost in time, handling of materials and inventory storage and handling of finished circuits. It is beneficial to a customer, and therefore to a manufacturer, that turn-around time, the cycle time between receipt of the custom-order ROM code and delivery of finished ROMs, be as short as possible. It is thus advantageous that ROM code programming be accomplished as late as possible in the manufacturing process. However in conventional fabrication of ROM cells, ROM programming occurs very early in the manufacturing process. For example, ROMs have been programmed by implanting ions prior to forming the polysilicon gate, an early step of the fabrication process.

Furthermore, in microcontrollers and microprocessors, advantageous operating capabilities result when on-chip ROM is used for program memory storage. On-chip ROM is a ROM memory array which is combined with other, non-memory types of circuits on a single integrated circuit chip. For example, a single-chip microcontroller may include an on-chip ROM which stores operating system program code. The usage of an on-chip ROM advantageously increases the operating speed of a computer system and reduces manufacturing and product costs. Economics of the manufacture of ROMs, particularly the economics of fabricating microprocessors and microcontrollers with on-chip ROMs, dictate that manufacturing costs be kept to a minimum. The complexity and cost of the fabrication process have a major impact on the overall manufacturing cost. Thus, it is greatly advantageous for on-chip ROMs to be fabricated in the same manufacturing process as the rest of the chip.

One method of fabricating a programmable MOS ROM is taught in U.S. Pat. No. 4,384,399 ('399), entitled "Method of Making a Metal Programmable Read Only Memory Device", to C. K. Kuo, which issued May 24, 1983. This patent describes a method of fabricating a metal programmable ROM using a single-metal layer, metal-gate MOS process. The ROM is programmed at the time the metal level of contacts and interconnections is patterned. Each potential MOS transistor in the array is programmed by patterning the metal using a photoresist mask and etch sequence in which an aperture open area, leaving exposed a gate oxide layer, is defined over each cell to be programmed as a logic "0" and each cell to be programmed as a logic "1" is left covered by metal to furnish a gate for the transistor. The logic "1" cells are not actual transistors but are instead stateless "non-transistors". After the metal layer is formed, the array is subjected to a boron ion implant which penetrates the gate oxide in exposed areas (logic "0" areas) to create an implanted region in the channel area which raises the threshold high enough so that charge spread in the channel region does not turn on the stateless non-transistor.

The '399 method disadvantageously requires an irregular manufacturing process having an ion implant following metal masking. The additional ion implant step increases the complexity, handling and processing time of the fabrication process. The requirement of a nonstandard manufacturing process greatly increases manufacturing and product costs.

An additional method of fabricating a programmable MOS ROM is taught in U.S. Pat. No. 4,390,971 ('971), entitled "Post-Metal Programmable MOS Read Only Memory", to C. K. Kuo and issued on Jun. 28, 1983. In a silicon-gate MOS process, the ROM is programmed following the deposition and patterning of a metal level of contacts and interconnections. An array of MOS transistors are formed prior to the deposition of the metal layer, setting all of the cells to a logic "1" value. Each cell in the array is selected to be programmed a logic "1" or a logic "0" by implanting ions through the polysilicon gates and thin gate oxide layer, using a patterned protective oxide as a mask or using photoresist as a mask prior to application of the protective oxide layer. The programming of the ROM bit-cells is done by controlling the transistor threshold voltage. In logic "1" memory cells, an implant is performed through the polysilicon gates and thin gate oxide, resulting in a higher transistor threshold voltage that consequently does not allow turn-on of the transistor. The logic "0" memory cells are regular N-channel transistors.

The '971 method, like the '399 method, disadvantageously requires a manufacturing process which is nonstandard and highly irregular. The requirement of a nonstandard manufacturing process greatly increases manufacturing and product costs.

A further method of fabricating a programmable MOS ROM is taught in U.S. Pat. No. 4,326,329 ('329), entitled "Method of Making a Contact Programmable Double Level Polysilicon MOS Read Only Memory", to D. J. McElroy and issued on Apr. 27, 1982. In the MOS process of the '329 patent, address lines are formed in a metal layer, gates are formed in a second level of polysilicon beneath the metal strip, and output and ground lines are defined by elongated N+ regions in the silicon wafer. Each potential MOS transistor in the array is programmed to be a logic "1" or a logic "0" by presence or absence of a contact which engages the polysilicon gate to the metal strip.

While the '329 patent method of programming of the ROM cells in the contact layer advantageously delays the programming step in comparison to conventional ROM programming techniques, several process steps remain following the programming step. The programming step of patterning a multilevel oxide layer, exposing selected gates in a ROM array area, is performed at least one mask step from the completion of the silicon processing. For example, a metal layer must be formed before processing is complete. It is desirable to delay the programming step further in the ROM fabrication process.

Furthermore, the '329 patent method of programming the ROM bit-cells by connecting or not connecting the ROM cell transistor gate to a metal address line results in many transistors with unconnected, floating gates. The presence of floating gates violates typical circuit design rules and elevates the risk of reliability problems.

The manufacturing processes which incorporate the '329, '971 and '399 patent methods are special processes which are different from a conventional CMOS polysilicon gate manufacturing process which is commonly used to fabricate microcomputers, microprocessors and microcontrollers and requires additional fabrication steps. Unfortunately each nonstandard step of a fabrication process raises the complexity and the cost of producing an integrated circuit chip.

SUMMARY OF THE INVENTION

In the present invention, both logic "0" and logic "1" memory cells are advantageously fabricated in the form of fully functional, reliable transistors. All transistor gates are connected to either the address lines or ground lines in a reliable design.

In the present invention, the programming step is advantageously delayed to the latest possible step in the manufacturing process. No further integrated circuit processing steps are performed after the programming step.

The fabrication process of the present invention is a standard two-metal layer polysilicon gate CMOS process. Usage of a standard fabrication process advantageously reduces manufacturing and product costs.

The present invention furnishes an on-chip ROM which advantageously increases the operating speed of a computer system and reduces manufacturing and product costs.

Furthermore, the present invention is a reliable low-cost manufacturing process which is substantially equivalent to a conventional CMOS polysilicon gate manufacturing technique so that the CMOS ROM is advantageously fabricated in the same process steps that are used to fabricate the other, non-ROM circuits on an integrated circuit chip.

The method embodiment of the present invention advantageously programs the ROM code at a time when a second, final metal interconnections layer is patterned, a time which is as late as possible in the steps of the fabrication process.

These and other advantages are achieved by a method of interconnecting an array of transistors in a CMOS read only memory. In this method, multiple bit-lines in a first metal layer are formed which overlie a substrate containing the array of transistors. The bit-lines are connected to drain regions of the transistors. A dielectric insulating layer is formed over the substrate and the bit-lines and the dielectric insulating layer is perforated by multiple vias which allow connection to the first metal layer. Multiple word-lines and multiple reference voltage lines are formed in a second metal layer overlying the dielectric insulating layer. Either a word-line or a reference voltage line is programmably selected to connect to the gate of a transistor for each transistor of the multiple transistors.

These and other advantages are also obtained in a semiconductor read only memory (ROM) which includes multiple switching transistors each having a polysilicon gate and source and drain regions formed in an active region of a semiconductor substrate. Multiple bit lines which are formed in a first metal layer are connected to the drains of the switching transistors through an insulating layer. Multiple reference voltage lines, which are formed in a second metal layer, are connected to the sources of the switching transistors through an insulating layer and programmably selected to be connected to the gates of the switching transistors that are programmed to a first logic level. Multiple word lines which are formed in the second metal layer are programmably selected to be connected to the gates of the switching transistors that are programmed to a second logic level.

BRIEF DESCRIPTION OF THE DRAWINGS

In the figures, in which like reference characters indicate like parts.

DETAILED DESCRIPTION OF A PREFERRED EMBODIMENT

Figure 1:
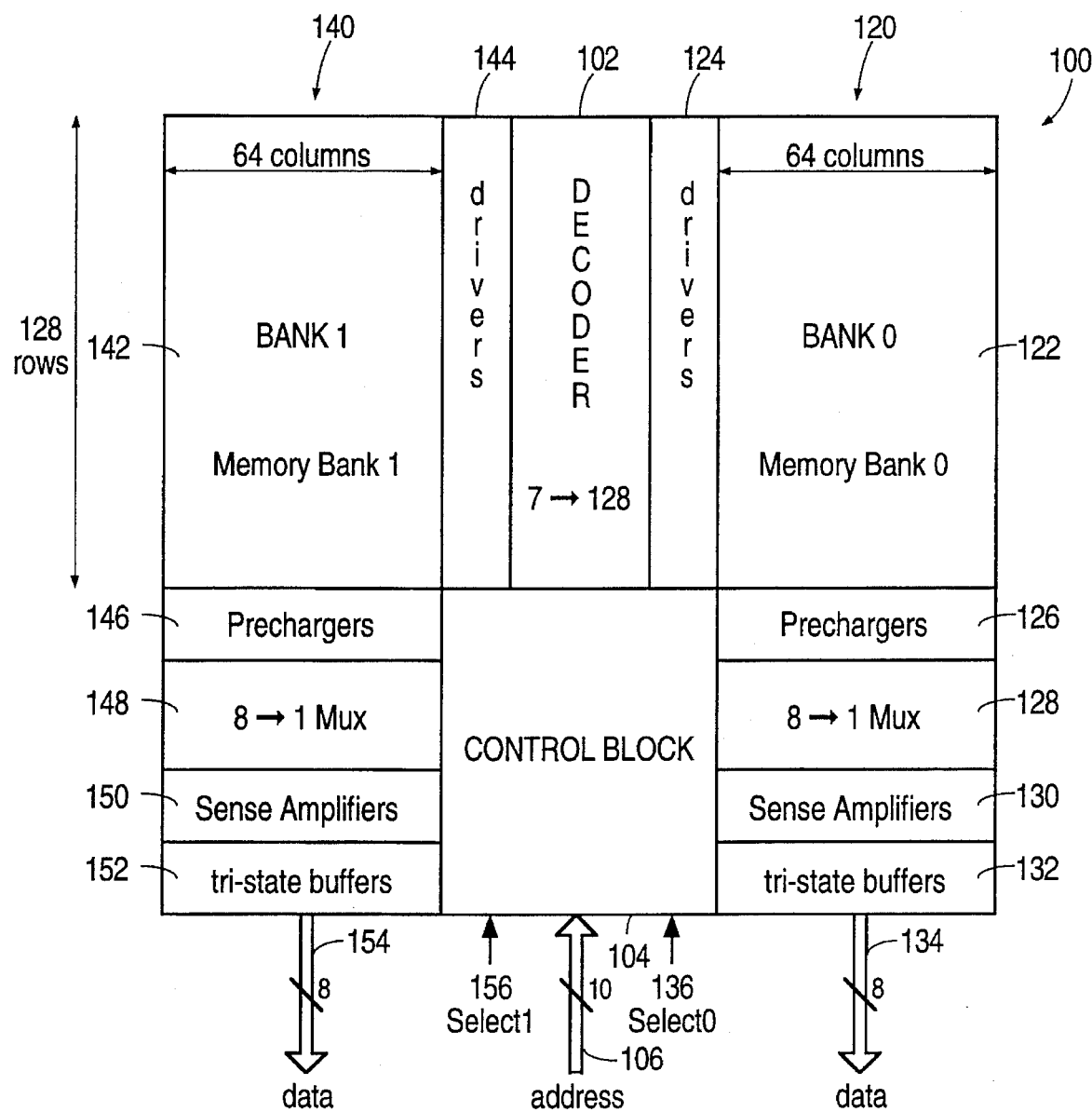
FIG. 1 is a block diagram of an embodiment of a two layer metal CMOS read only memory (ROM)

Referring to FIG. 1, a block diagram of an embodiment of a two layer metal CMOS read only memory (ROM) 100 is shown which describes, in particular, a 2 Kbyte on-chip ROM. Although a 2 Kbyte on-chip ROM is described, it is to be understood the described ROM size and configuration are simply typical of a ROM embodiment and that other ROM sizes and configurations are within the scope of the invention. ROM 100 includes a first bank 120 and a second bank 140, each furnishing memory storage and memory accessing. First bank 120 and second bank 140, respectively include a first memory array 122 and a second memory array 142, a first drivers circuit 124 and a second drivers circuit 144, a first precharge circuit 126 and a second precharge circuit 146, a first 8-to-1 multiplexer 128 and a second 8-to-1 multiplexer 148, a first sense amplifiers circuit 130 and a second sense amplifiers circuit 150, a first tri-state buffers circuit 132 and a second tri-state buffers circuit 152, and a first 8-bit data bus 134 and a second 8-bit data bus 154. The first bank 120 and the second bank 140 share a dynamic 7-to-128 address decoder 102 and a control block 104. Control block 104 receives address signals from a 10-bit address bus 106, a first bank chip-select line 136 and a second bank chip-select line 156.

Figure 2:
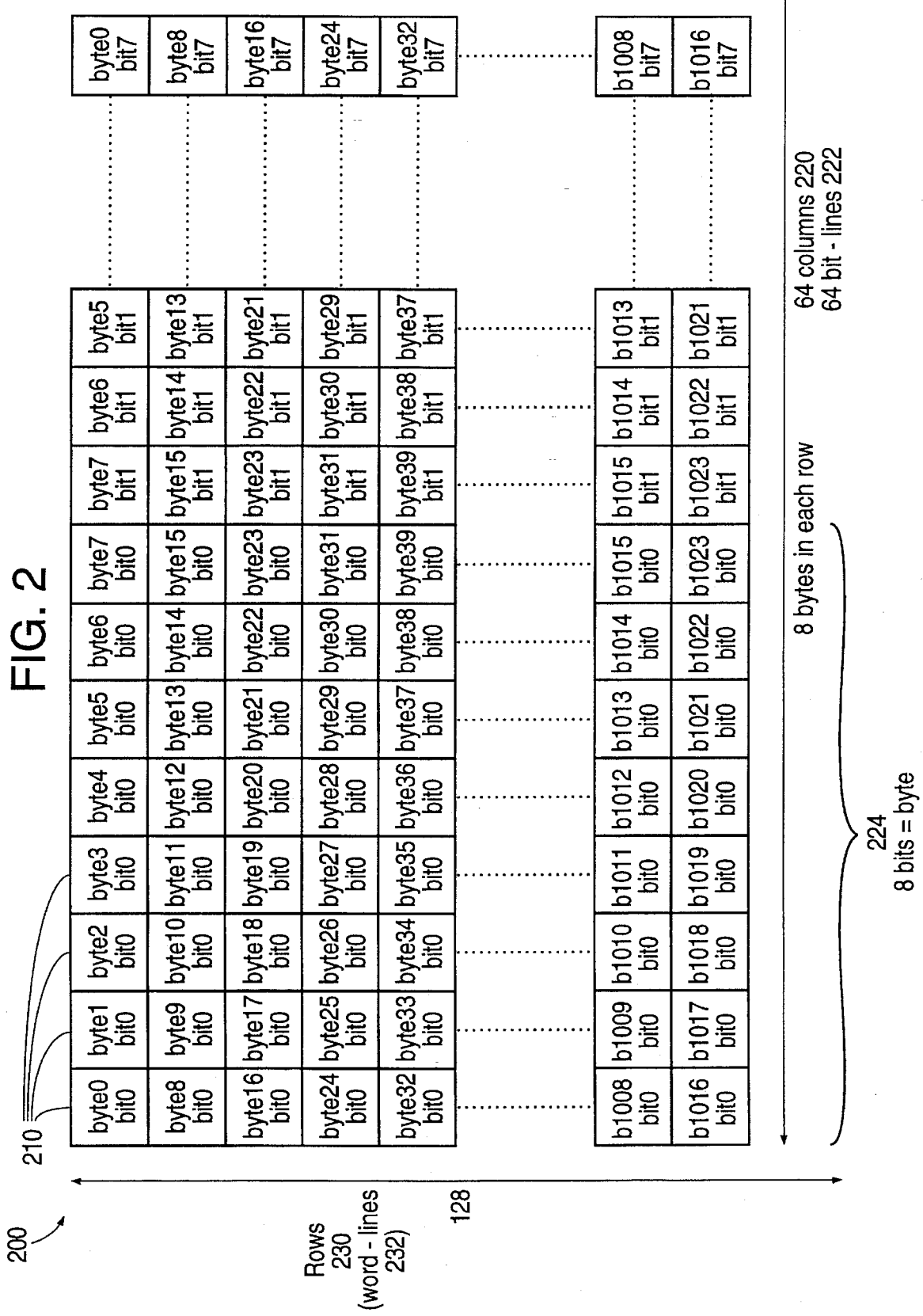
FIG. 2 is a pictorial representation of a memory array in the ROM shown in FIG. 1.

Each of first memory array 122 and second memory array 142 is a memory bank 200 which includes 8192 memory cells 210 as are depicted in FIG. 2. The 8192 memory cells 210, which are arranged in 1024 8-bit bytes, are organized in a 128 rows 230 times 64 columns 220. Each of the 64 columns 220 corresponds to one of 64 bit-lines 222. The 64 bit-lines 222 are grouped into eight 8-bit bytes. Each of the 128 rows 230 corresponds to one of 128 word-lines 232, which are also commonly called address lines. First memory array 122 includes byte addresses 0–1023. Second memory array 142 includes byte addresses 1024–2047.

Referring again to FIG. 1, address signals are applied to control block 104 by address bus 106. ROM 100 is accessed for reading when one of the bank chip-select lines 136 and 156 is asserted high and a rising-edge is detected by a circuit (not shown) of control block 104. Control block 104 generates control signals for accessing the memory arrays 122 and 142 and for controlling the precharge circuits 126 and 146, the sense amplifiers 130 and 150, and the drivers 124 and 144. Control block 104 receives address signals from address bus 106 and applies the seven most-significant-address bits (MSB) of the address signals to address decoder 102. Address decoder 102 is a 7-to-128 NAND-type decoder which drives the address lines from control block 104 to both memory banks 120 and 140. The seven MSB address signals are then decoded by address decoder 102 and one of the 128 word-lines 232 is asserted high and thus activated. The decoded address signals are applied to the selected bank memory array of memory arrays 122 and 142 by the appropriate driver of drivers 124 and 144.

Each precharge circuit 126 and 146 includes 64 precharge cells, one cell for each of the 64 columns and, thus, one for each bit-line. Prior to a read operation and at all times a memory array of the memory arrays 122 and 142 is not accessed for read, the 64 precharge cells of the corresponding first or second precharge circuit 126 or 146 apply a precharge operation to the 64 bit-lines 222 of the memory array. The precharge operation charges all bit-lines of the memory cells of the memory arrays 122 and 142, so that a logic "1" is read out from memory cells programmed to logic "1" during the manufacturing process. When a memory array 122 or 142 is accessed for reading, following the precharge operation, the bit-lines 222 connected to the decoded address lines (word-lines 232) which are programmed to logic "0" during the manufacturing process are discharged by an N-channel transistor 300 shown in FIG. 3, while the bit-lines 222 connected to word-lines 232 which are programmed to logic "1" cells remain precharged. In this manner, 64 bits of data in the selected word-line 128 are accessed from the selected array of memory arrays 122 and 142 as directed by the address signals.

The control block 104 applies the three least significant address bits (LSB) of address bus 106 to a selected multiplexer of the first and second 8-to-1 multiplexers 128 and 148. Each 8-to-1 multiplexer circuit 128 and 148 includes a row of eight 8-to-1 multiplexers. Eight bits of data, forming one data byte, of the 64 bit-lines 222 are selected by an 8-to-1 multiplexer 128 or 148 in accordance with these three address LSBs. The byte is sensed by a sense amplifier of the corresponding sense amplifiers 130 and 150 and driven onto the data bus of the data busses 134 and 154 by the respective tri-state buffers circuit 132 or 152. Each sense amplifier circuit 130 and 150 includes a row of eight single-bit sense amplifiers, one for each selected bit-line. Each of the tri-state buffers circuits 132 and 152 includes a row of eight buffers, one for each of the eight data bits. A tri-state buffer circuit 132 or 152 drives data onto the data bus 134 or 154, respectively, when the appropriate bank chip-select line 136 or 156 is asserted.

A memory cell 210 is programmed to either a logic "1" state or a logic "0" state. Each bit of information in a ROM is stored by second metal layer polygons which connect the address lines or ground lines to the transistor gate of a cell, thereby programming the cell to a logic "0" or a logic "1", respectively Prior to the read operation, the bits-lines are precharged to charge all the outputs of the memory cells, both logic "0" and logic "1" cells. When the memory is accessed during the read operation, the logic "0" cells are discharged by N-channel transistor 300 while the logic "1" cells remain precharged. In this manner, a logic "1" is read from those memory cells programmed to a logic "1" and a logic "0" is read from those memory cells programmed to a logic "0" during the manufacturing process.

Figure 3:
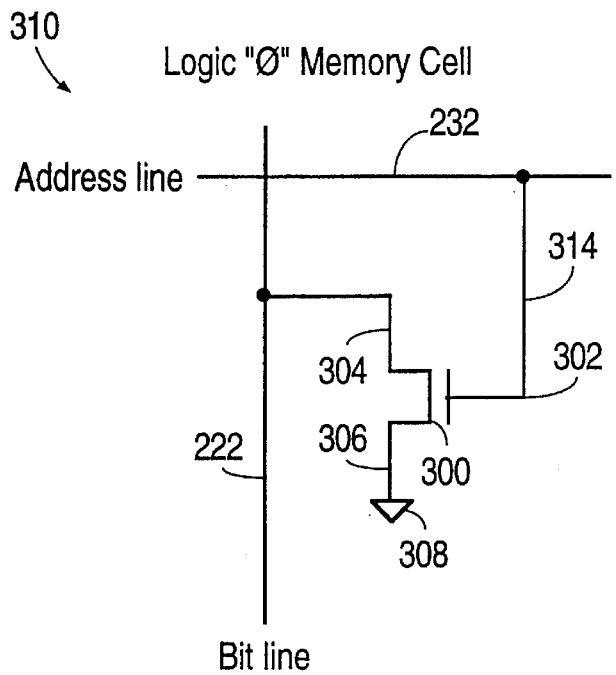
FIGS. 3 and 4 are circuit diagrams showing, respectively, a programmed logic "1" memory cell and a programmed logic "0" memory cell, which memory cells are duplicated throughout the memory array shown in FIG. 2.
Figure 4:
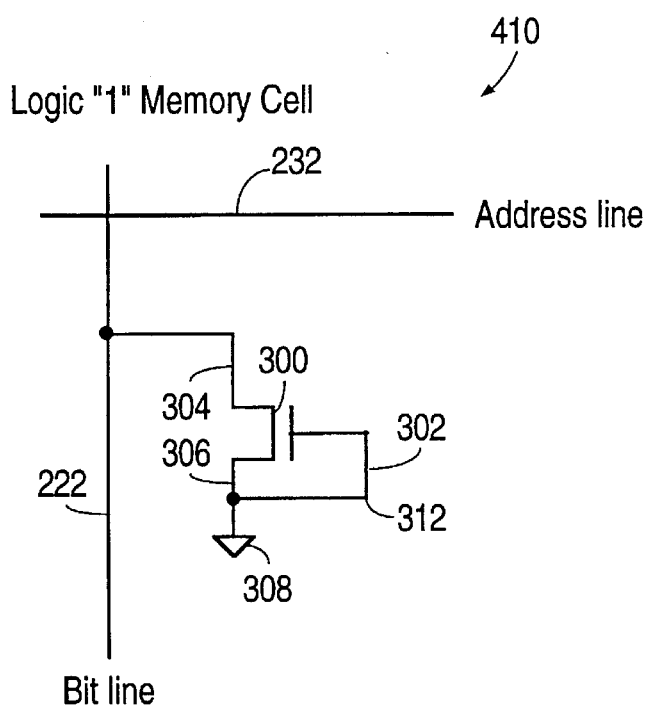

Referring to FIGS. 3 and 4 respectively, a logic "0" memory cell 310 and a logic "1" memory cell 410 each depict memory cells 210 of a memory bank 200. Each memory cell 210 is a CMOS N-channel transistor 300 having a gate 302, a source 304 and a drain 306, in which the source 304 is part of an N⁺ diffused region which is connected to a reference (VSS) or ground voltage connection 308. The drain 304 is part of an N⁺ diffused region which is connected to a bit-line 222. The connection of the gate 302 determines whether the memory cell 210 is a logic "0" memory cell 310 or a logic "1" memory cell 410. For a logic "0" memory cell 310, gate 302 is connected to a word-line 232. For a logic "1" memory cell 410, gate 302 is connected to the reference (VSS) connection 308. The bit-lines 222 are laid out in a first metal layer 780, shown in FIG. 17. Word-lines 232 and reference (VSS) lines 308 are laid out in a second metal layer 560, 562 and 550, shown in FIG. 5. In this manner memory arrays 122 and 142 are programmed by fabrication of respective second metal layer polygons 314 and 312, which programmably connect either the word-lines 232 or the ground lines 308 to the gate 302, thus generating a logic "0" cell or a logic "1" cell, respectively. Programming is therefore advantageously accomplished at the latest possible step of the fabrication process.

Figure 5:
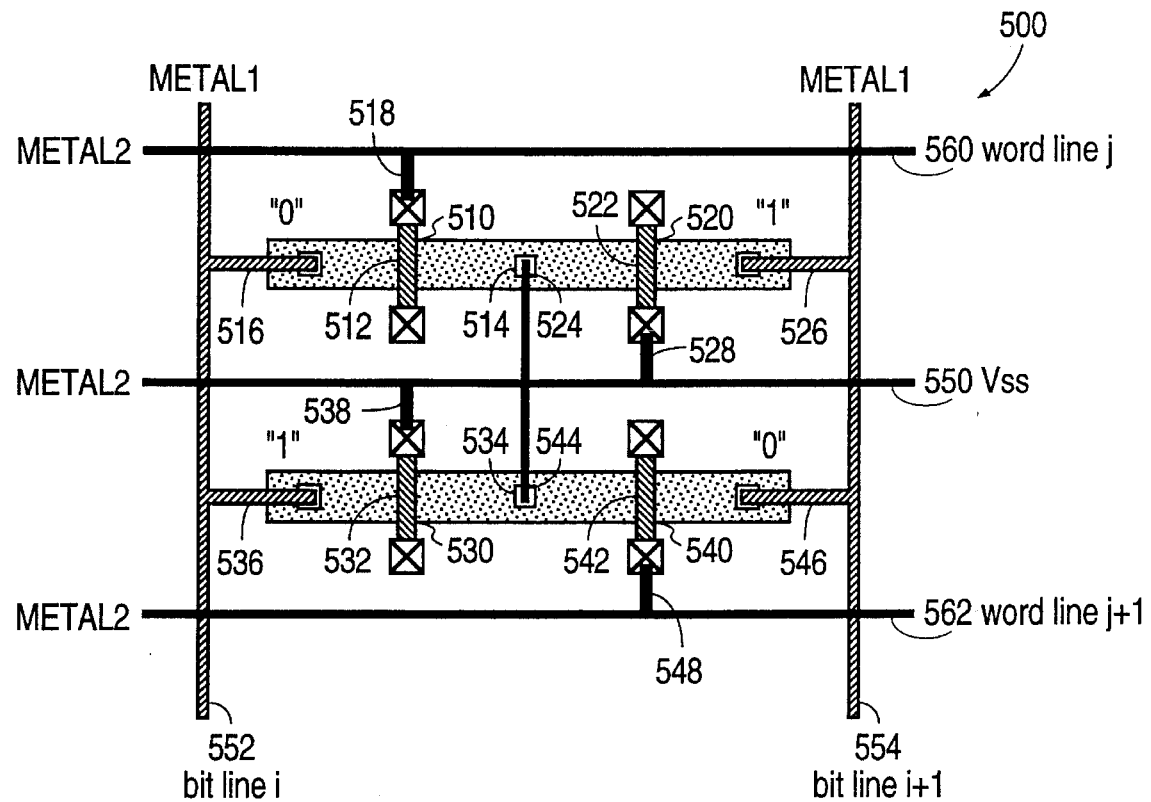
FIG. 5 is a pictorial schematic diagram illustrating the programming of a memory cell which is duplicated throughout the memory array shown in FIG. 2.
Figure 6:
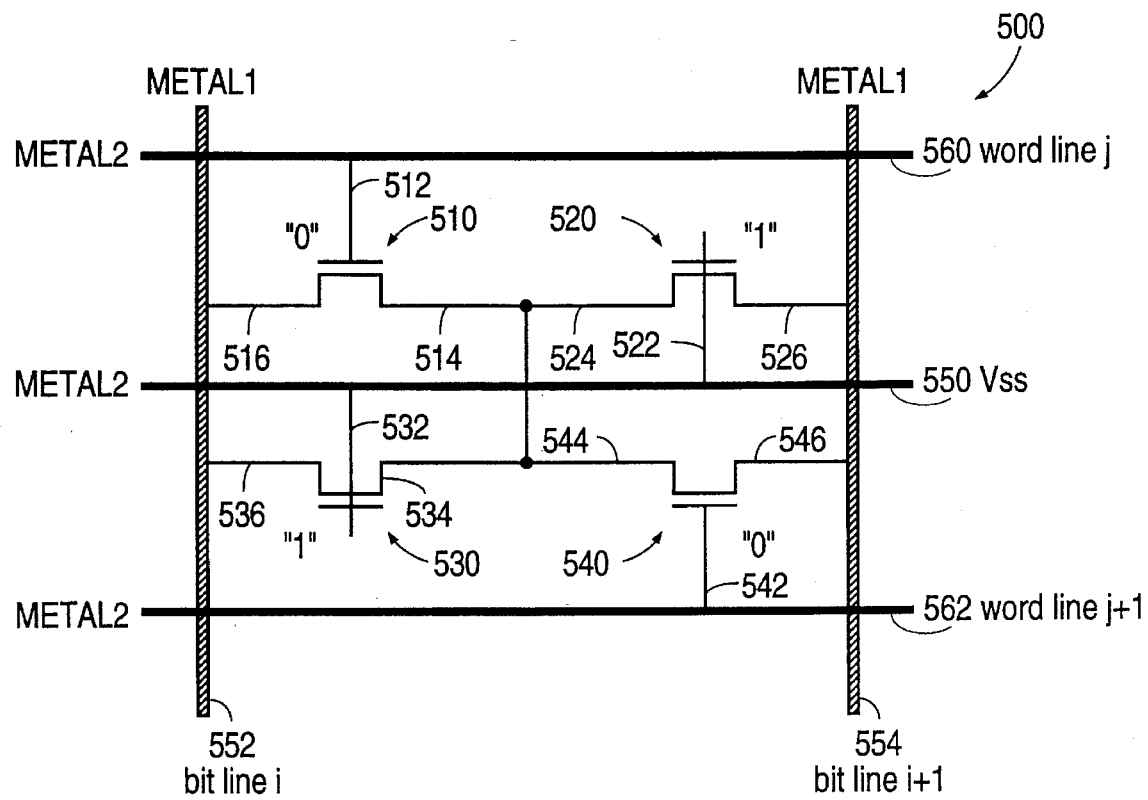
FIG. 6 is a schematic diagram depicting the gate, source and drain interconnections of the memory cell which is illustrated in FIG. 5.

FIG. 5 shows a pictorial schematic diagram illustrating the programming of a memory cell 210. FIG. 6 illustrates a schematic diagram depicting the gate, source and drain interconnections of the memory cell 210 illustrated in FIG. 5. An exemplary memory array region 500 includes a group of four CMOS N-channel transistors 300. The N-channel transistors 300 form a first logic "0" memory cell 510, first logic "1" memory cell 520, a second logic "1" memory cell. 530 and a second logic "0" memory cell 540. First logic "0" memory cell 510 has a gate 512, source 514 and drain 516. First logic "1" memory cell 520 has a gate 522, source 524 and drain 526. Second logic "1" memory cell 530 has a gate 532, source 534 and drain 536. Second logic "0" memory cell 540 has a gate 542, source 544 and drain 546. Each of gates 512, 522, 532 and 542 is furnished by a polysilicon structure in the form of a polygon. Each of the sources 514, 524, 534 and 544 is part of an N⁺ diffused region (see source region 754 shown in FIG. 15) which is connected to a reference or ground line VSS 550. Each of the drains 516, 526, 536 and 546 is part of part of an N⁺ diffused region (see drain region 754 shown in FIG. 15) which is connected to a bit-line 552 or 554. Drains 516 and 536 are connected to bit-line i 552. Drains 526 and 546 are connected to bit-line i+1 554. Bit-line i 552 and bit-line i+1 554 are laid out in the first metal layer 780, shown in FIG. 7. A word-line j 562 and a word-line j+1 564 and ground line VSS 550 are laid out in the second metal layer 538 shown in FIG. 5.

Memory cells 510, 520, 530 and 540 are programmed by second metal layer structures in the shape of polygons which selectively connect either a word-line of the word-line j 560 and word-line j+1 562, or the ground VSS line 550 to the gate 512, 522, 532 and 542 of an N-channel transistor. Specifically, second metal layer polygon connects gate 512 of first logic "0" memory cell 510 to word-line j 560. Similarly, second metal layer polygon 528 connects gate 522 of first logic "1" memory cell 520 to ground VSS line 550. Second metal layer polygon 538 connects gate 532 of second logic "1" memory cell 530 to ground VSS line 550.

Second metal layer polygon 548 connects gate 542 of second logic "0" memory cell 540 to word-line j+1 562.

ROM 100 is fabricated using a standard two-layer metal CMOS process, the same process as that used to fabricate other on-chip circuits (not shown) other than memory array circuits. Thus the two-layer metal CMOS process provides that the memory arrays 122 and 142 are fabricated using the same processing steps employed to fabricate the drivers 124 and 144, the precharge circuits 126 and 146, the multiplexers 128 and 148, the sense amplifier circuits 130 and 150, the tri-state buffer circuits 132 and 152, the address decoder 102, the control block 104 and other standard CMOS circuit devices.

Figure 7:
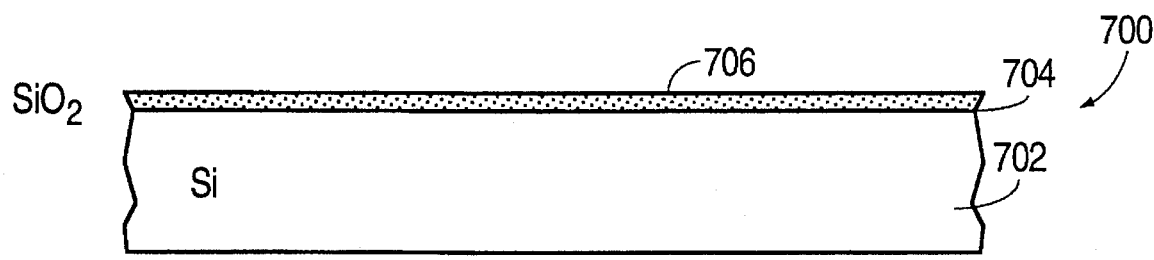
FIGS. 7 through 22 are process sectional views showing an embodiment of a method for fabricating a memory cell within the memory array depicted in FIG. 2.

The two-layer metal CMOS process includes steps for fabricating ROM memory arrays 122 and 142 which are described with reference to FIGS. 7 through 14. Referring to FIG. 7, a P-type monocrystalline silicon wafer 702 is a starting material for fabricating a ROM memory array 700. A typical silicon wafer 702 is 3 inches in diameter, twenty mils thick and cut on the <100> plane. Silicon wafer 702 resistivity typically ranges from about 6 to 8 ohm-cm. After suitable cleaning, silicon wafer 702 is oxidized by exposure to oxygen in a furnace at an elevated temperature, typically about 1100° C., to produce an oxide layer 706 (commonly silicon dioxide ($SiO_2$)) overlying a frontside surface 704 of the silicon wafer 702. A standard thickness of the oxide layer 706 is approximately 500 Å.

Figure 8:
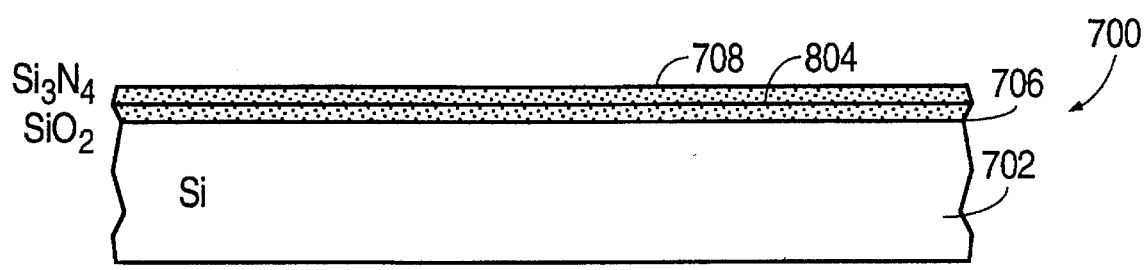

A layer of silicon nitride ($Si_3N_4$) 708 having a thickness typically in the range of approximately 1000 Å to 1500 Å is formed on a frontside surface 804 of the silicon wafer 702 overlying the oxide layer 706, as is illustrated in FIG. 8. Silicon nitride layer 708 is formed by exposing the silicon wafer 702 to an atmosphere containing dichlorosilane and ammonia in a low pressure chemical vapor deposition (LPCVD) reactor (not shown).

A coating of photoresist (not shown) is applied to the entire frontside of silicon wafer 702 and exposed to an ultraviolet light (not shown) through an N-well mask (not shown) which defines a selected pattern for diffusion regions of CMOS P-channel transistors.

Figure 9:
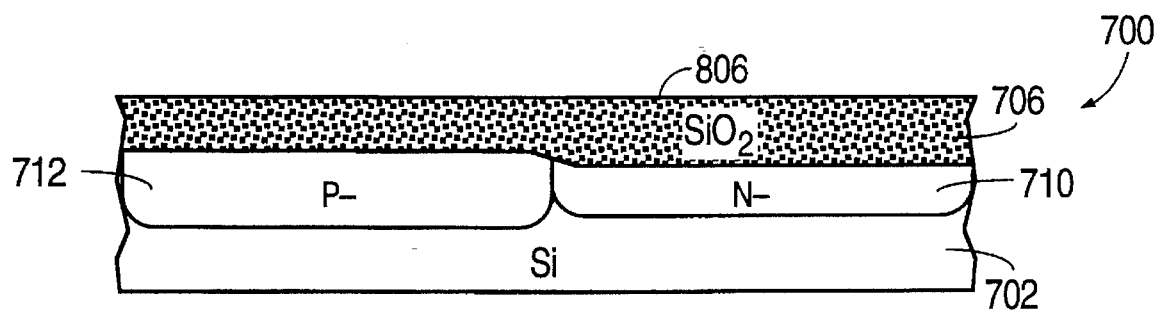

Referring to FIG. 9, the photoresist is developed, leaving a selected pattern of areas of frontside surface 806 unprotected. In these areas, the silicon nitride layer 708 is etched away by a nitride etchant, removing portions of the silicon nitride layer 708 that were exposed but leaving in place the oxide layer 706. The silicon nitride etchant does not react with the photoresist.

With the remaining portions of the photoresist layer (not shown) and the silicon nitride layer 708 forming a mask (not shown) on the frontside surface 806 of the silicon wafer 702, the silicon wafer 702 substrate is implanted with ions using an ion implant step to produce an N-well region 710. The N-well 710 ion implant step introduces phosphor ions into unmasked regions of silicon wafer 702. The oxide layer 706 left in place during the ion implant step prevents the implanted phosphor atoms from out-diffusing from the frontside surface 806 during subsequent application of heat treatments.

A P-well region 712 is formed by growing a first temporary oxide layer (not shown), which overlies selected portions of the N-well region 710 but not overlying other regions of the silicon wafer 702. Remaining areas of the silicon nitride layer 708 are removed by etching. A P-well implant process is applied to create the P-well region 712 and a selective oxide etchback process removes patterned portions of the new oxide layer. The P-well 712 ion implant step typically introduces boron ions into unmasked regions of silicon wafer 702. An oxide stripping step removes remnants of the first temporary oxide layer so that the frontside surface 806 of the silicon wafer 702 is uncovered so that the P-well region 712 and the N-well region 710 extend to the frontside surface 806.

Figure 10:
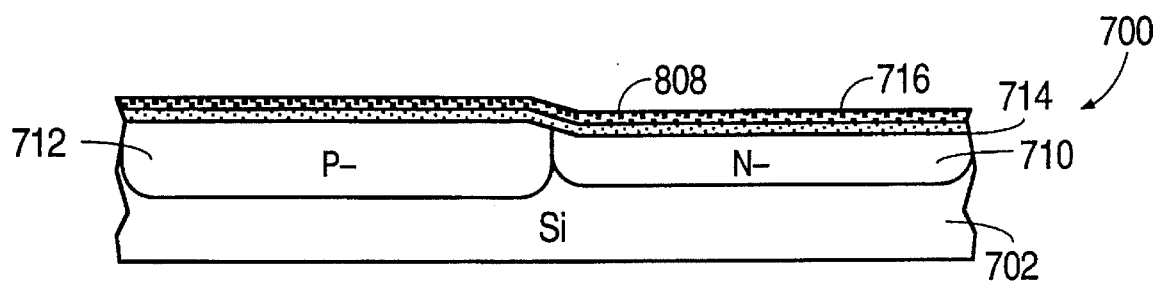

Referring to FIG. 10, a pad oxide layer 714 is deposited which covers the entire frontside surface 808 of the silicon wafer 702 with a silicon dioxide film typically having a thickness of about 300 Å. A silicon nitride layer 716 having a thickness of approximately 2000 Å is deposited which covers the frontside surface 808 of the silicon wafer 702 overlying entire pad oxide layer 714.

Figure 11:
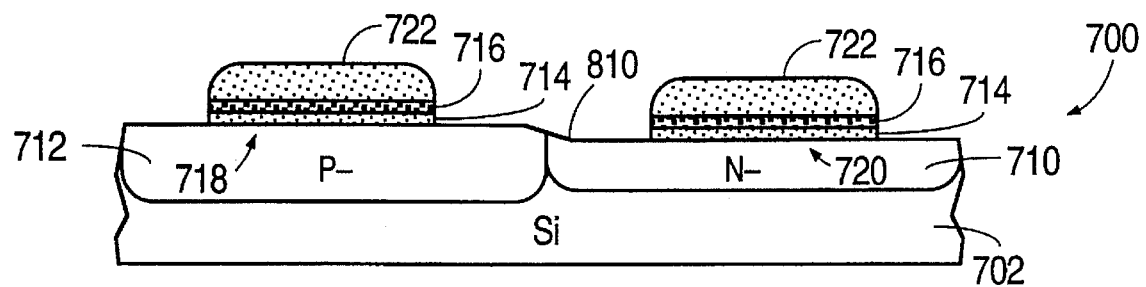

Referring to FIG. 11, P-field regions are created in which $P^+$ channel stop surface regions 718 and 720 are first selectively patterned on the frontside surface 810 of the silicon substrate 702. The $P^+$ channel stop surface regions 718 and 720 protect regions of the silicon substrate 702 at which CMOS transistor channels are subsequently placed. A layer of photoresist 722 is deposited over the entire frontside surface 810 of the silicon substrate 702, overlying the silicon nitride layer 716. A composite mask (not shown), which defines a selected pattern for $P^+$ channel stop regions 718 and 720, is applied to the layer of photoresist 722. The photoresist layer 722 is patterned by exposing the layer 722 to ultraviolet light through the composite mask. The photoresist layer 722 is developed, leaving surface area regions unprotected. An etching process removes the silicon nitride layer 716 in the unprotected regions. The process for patterning the silicon nitride layer 716 is repeated to pattern the pad oxide layer 714, using a photoresist mask but employing a silicon dioxide etchant rather than a silicon nitride etchant.

Figure 12:
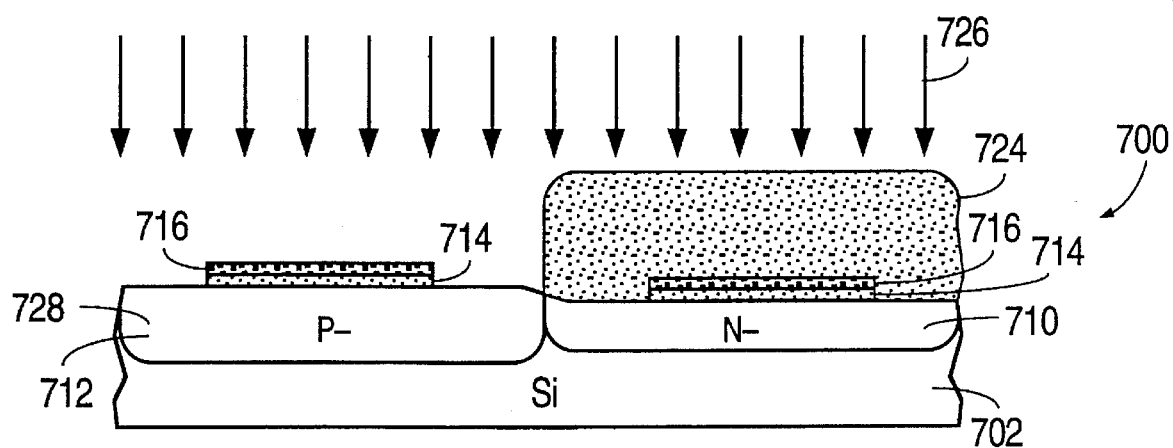

Photoresist layer 722 is stripped and a P-field mask photoresist layer 724 is applied to the frontside surface 810, overlying the P-well region 712, the N-well region 710 and the patterned silicon dioxide layer 714 and silicon nitride layer 716. The P-field mask photoresist layer 724 is patterned and etched to protect the N-well region 710 and to leave the P-well region 712 unprotected, as is shown in FIG. 12. A BF2 ion implant process 726 is applied to implant a P-field region 728. The BF2 ions do not penetrate the silicon nitride 716 and silicon dioxide 714 layer stack.

Figure 13:
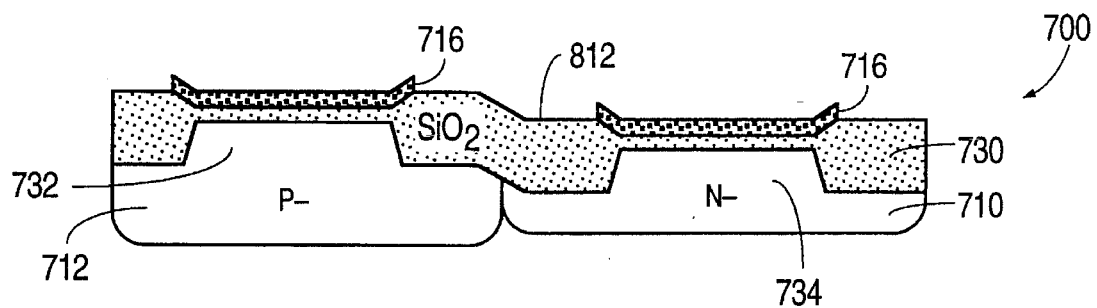
Figure 14:
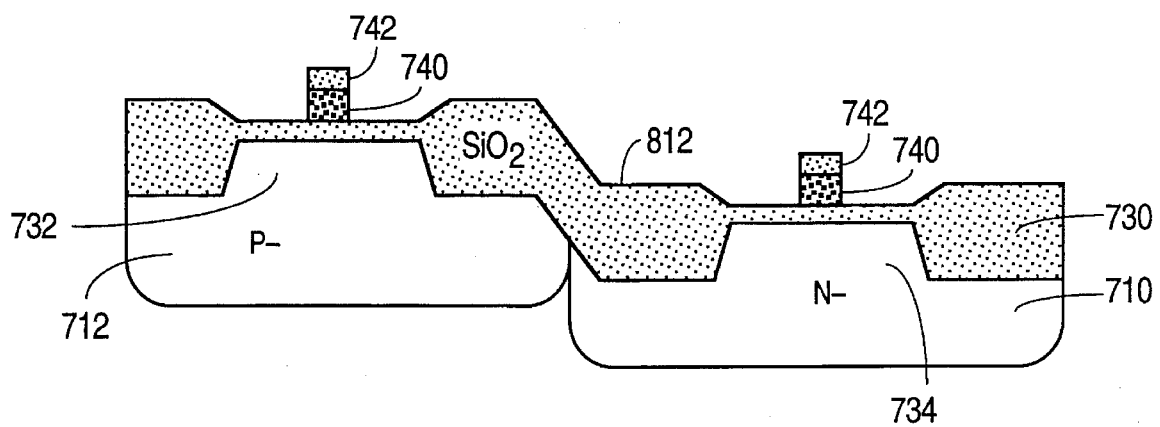

Referring to FIG. 13, a field oxide region 730 is grown in a thick layer by applying an oxidation process to the silicon wafer 702. The field oxide region 730 is grown over a frontside surface 812 of the P-well region 712 and the N-well region 710. The field oxide region 730 is formed by applying an oxidizing atmosphere, such as steam, to the silicon wafer 702. In one example of an oxidizing process, the silicon wafer 702 is held in steam at a temperature of approximately 900° C. for about five hours. The field oxide region 730 extends into the surface of the silicon wafer 702, including the P-well region 712 and the N-well region 710, as silicon is consumed as it is oxidized. The typical thickness of the field oxide layer 730 is approximately 7000 Å, about half which is above the original frontside surface 812 and half below. During formation of field oxide layer 730, silicon nitride layer 716 constrains oxidation of silicon in a P-well channel region 732 and an N-well channel region 734.

Silicon nitride layer 716 is typically removed by wet etching in hot phosphoric acid. The substrate wafer 702 is carefully cleaned and a high-quality thermal gate oxide layer 740 is grown to a thickness of approximately 500 Å in dry oxygen to furnish a gate oxide insulator. Following gate oxide formation, threshold voltage (Vt) is adjusted by performing an ion implant process. In the ion implant process, boron ions are implanted without masking to adjust the threshold voltage (Vt) of enhancement-mode semiconductor devices. Arsenic ions are implanted using a mask to adjust the threshold voltage (Vt) of depletion-mode devices.

A layer of polycrystalline silicon (polysilicon or poly) 742 is deposited to a thickness of approximately 5000 Å overlying the entire frontside surface 812 of the substrate wafer 702 by applying a low pressure chemical vapor deposition (LPCVD) process to form a polysilicon gate layer 742. The polysilicon gate layer 742 is made highly conductive by heavy doping with phosphorus in an $N^+$ ion diffusion step. Polysilicon gate layer 742 is then patterned by applying a layer of photoresist (not shown), exposing the photoresist layer to ultraviolet light through a preformed mask, developing the photoresist layer and simultaneously etching the photoresist layer and exposed gate oxide layer 740. The unmasked polysilicon layer 742 is removed by etching, leaving the structure shown in FIG. 14.

Polysilicon sidewalls 744 are formed on sides of the polysilicon gate layer 742 and the entire frontside surface 812 is overlaid by a sealing oxide layer (not shown) having a typical thickness of about 100 Å.

A lightly doped drain (LDD) implant is performed to form an LDD region 756, including LDD source 752 and LDD drain 754 implant regions in the P-well channel region of an N-channel transistor 750. To perform the LDD implant, a coating of photoresist (not shown) is applied to the entire frontside surface 812 of the silicon wafer 702 and exposed to ultraviolet light through an selectively formed LDD mask (not shown). The photoresist coating is developed, etched and LDD ions are implanted.

Figure 15:
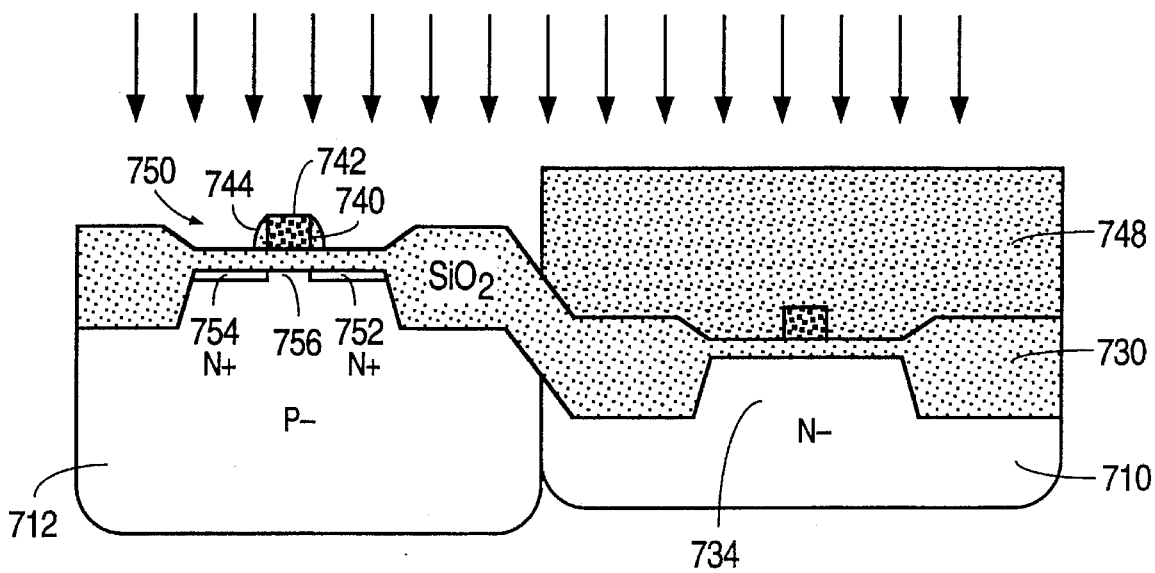

FIG. 15 depicts a structure resulting from a conventional heavy implanting of N ions into the N-channel transistor 750 in which a photoresist layer 748 is deposited and etched to expose the P-well region 712 and to protect the N-well region 710 of the silicon wafer 702.

Figure 16:
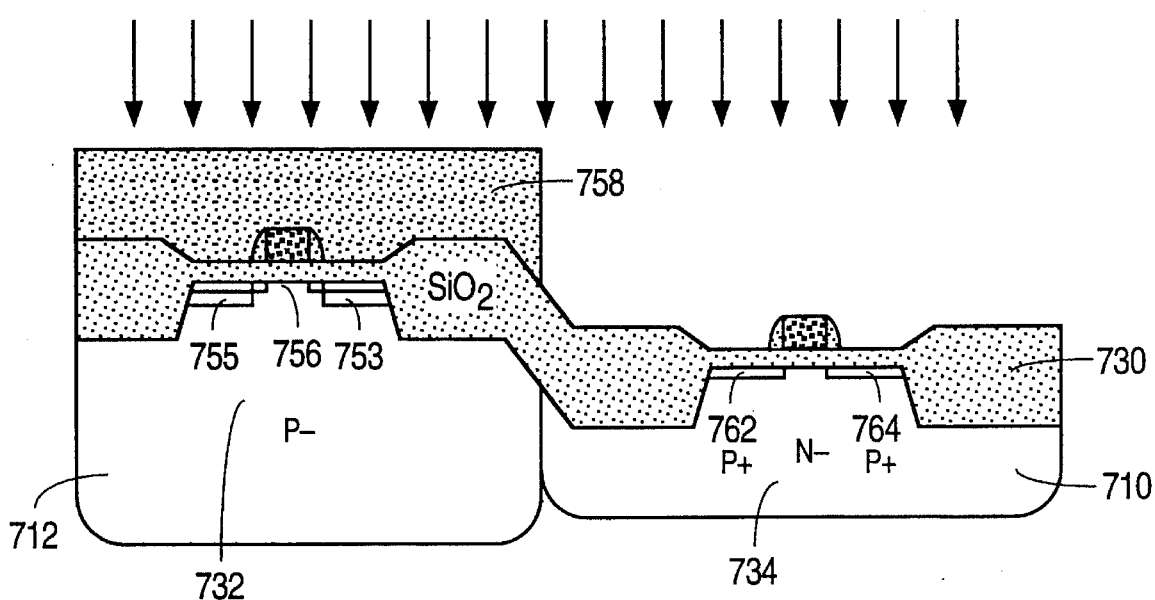

FIG. 16 illustrates a structure resulting from a conventional heavy implanting of P ions into the P-channel transistor 760 in which a photoresist layer 758 is deposited and etched to expose the N-well region 710 and to protect the P-well region 712 of the silicon wafer 702.

A conventional $N^+$ and $P^+$ diffusion operation is applied to produce the $N^+$ source region 753 and $N^+$ drain region 755 for the N-channel transistor 750 and the $P^+$ source region 762 and $P^+$ drain region 764 for the P-channel transistor 760 for transistors in the ROM memory arrays 122 and 142 as well as for transistors in other non-ROM circuits (control block 104 and decoder 102 shown in FIG. 1, for example). Thus, the ROM transistors and non-ROM transistors are fabricated in the same processing steps.

Figure 17:
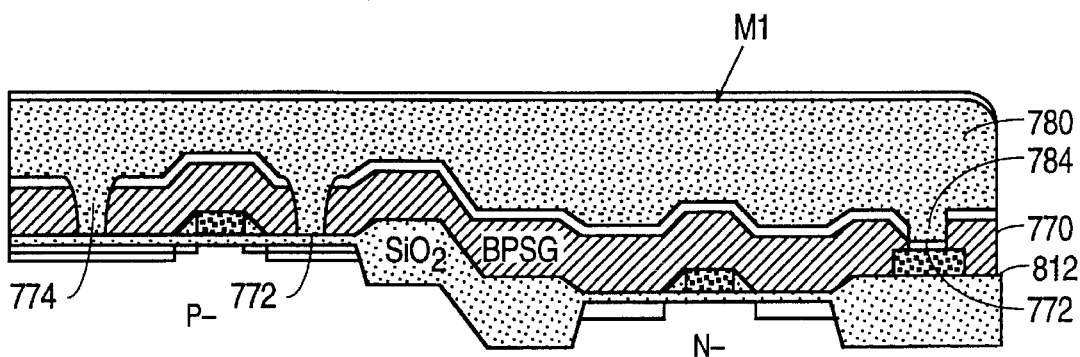
Figure 18:
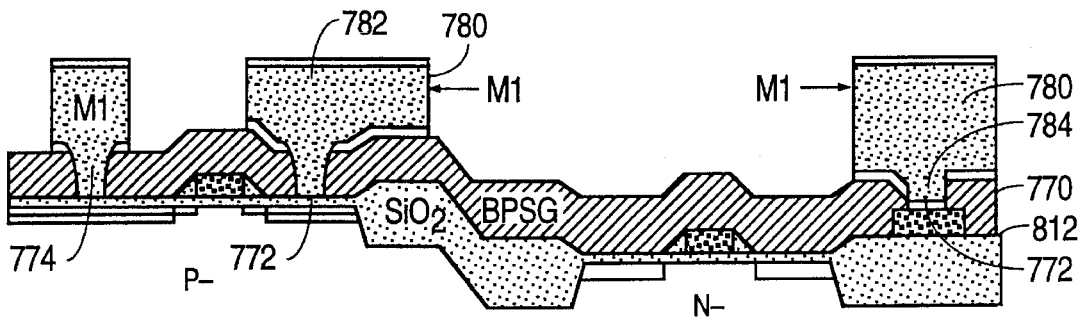

Except for metallization, CMOS N-channel and P-channel transistors are produced in the process steps illustrated by FIGS. 7 through 16. Metallization steps, which are used to form interconnections between the devices, are depicted in subsequent FIGS. 17 through 22. Referring to FIG. 17, a borophosilicate glass (BPSG) layer 770 is deposited to a thickness of, for example, approximately 7000 Å on the frontside surface 812 of the cleaned silicon wafer 702, overlying the field oxide layer 730, the polysilicon gate 742 and the polysilicon sidewalls 744. BPSG layer 770 furnishes insulation between the polysilicon gate 742 and subsequently formed overlying metal layers. A planarization operation, called a BPSG reflow operation, is applied to BPSG layer 770. BPSG reflow flattens the frontside surface 812 of the substrate wafer 702 and facilitates formation of a first metal layer 780. The BPSG reflow technique is employed to shape contact holes 772 and 774 for metal interconnections so that the metal deposited into the contact holes 772 and 774 furnishes good step coverage. Generally, step coverage is improved when the walls of the contact opening are sloped and the top corners are rounded. BPSG, which flows at low temperatures (800° to 850° C. at atmospheric pressure), is useful for reflow processing.

Following the BPSG reflow step, BPSG layer 770 is patterned using photoresist deposition thereby uncovering the contact holes 772 and 774 for forming metal-to-silicon contacts. Contacts between metal layers and silicon are formed in a conventional process of sputtering a thin film of aluminum over the entire frontside surface 812 of the substrate wafer 702 and patterning the aluminum first metal layer 780 using a photoresist mask and etch process, resulting in a structure shown in FIG. 18. The first metal layer 780 forms the bit-lines 222 of the ROM memory arrays 122 and 142 shown in FIGS. 1 and 2. The first metal layer 780 also forms contacts 782 and metal strips 784 for connecting the polysilicon gate 742 of the ROM bit-cell N-channel transistors 300 shown in FIG. 3.

Figure 19:
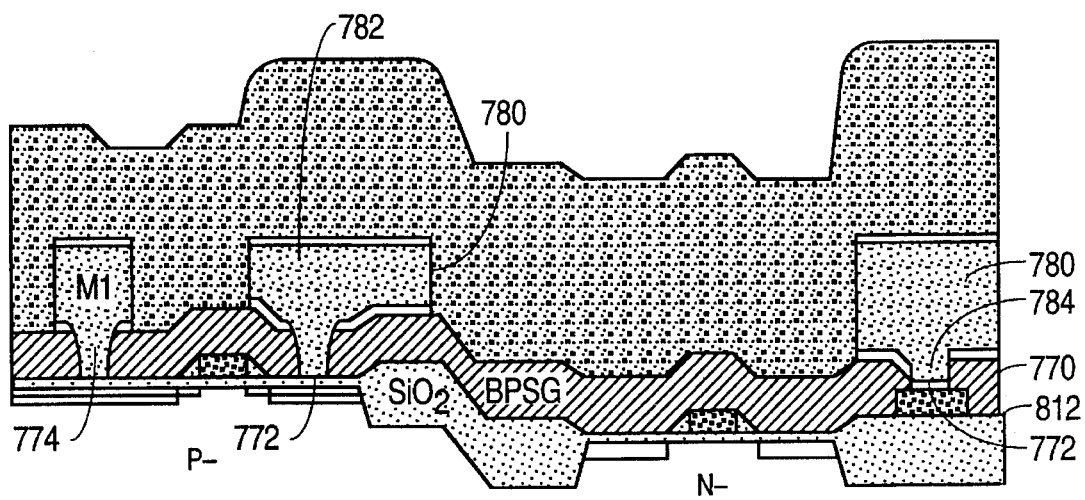

Referring to FIG. 19, a thick dielectric layer 786 is formed overlying the frontside surface 812 of the substrate wafer 702. Dielectric layer 786 covers BPSG layer 770 and the contacts 782 and metal strips 784 of first metal layer 780. Dielectric layer 786 is suitably constructed from a dielectric material, such as a CVD $SiO_2$ film (e.g. low temperature CVD $SiO_2$), and has a thickness of, for example, approximately 2000 Å. Dielectric layer 786 is formed to insulate the first metal layer 780 from a subsequently-formed second metal layer 790, which is shown in FIG. 20.

Figure 20:
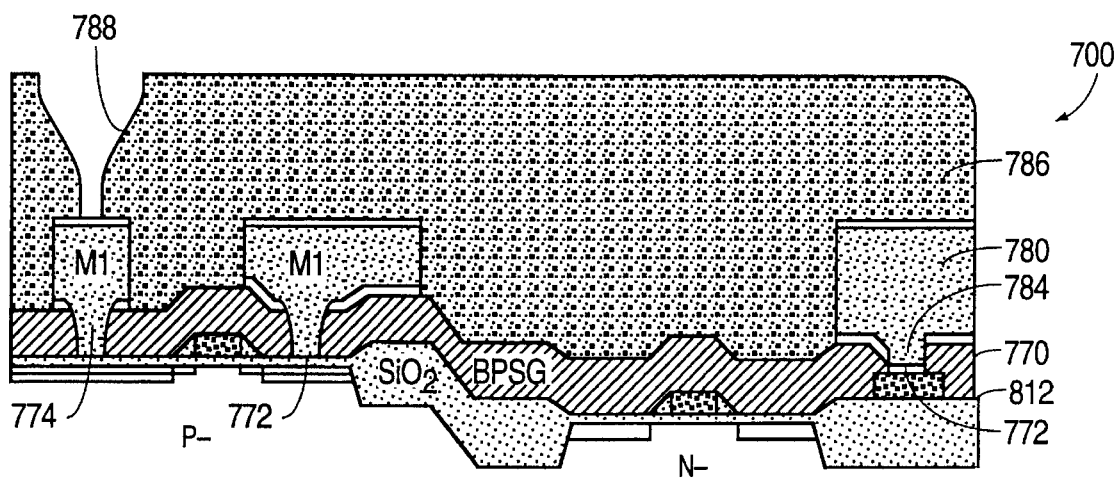
Figure 21:
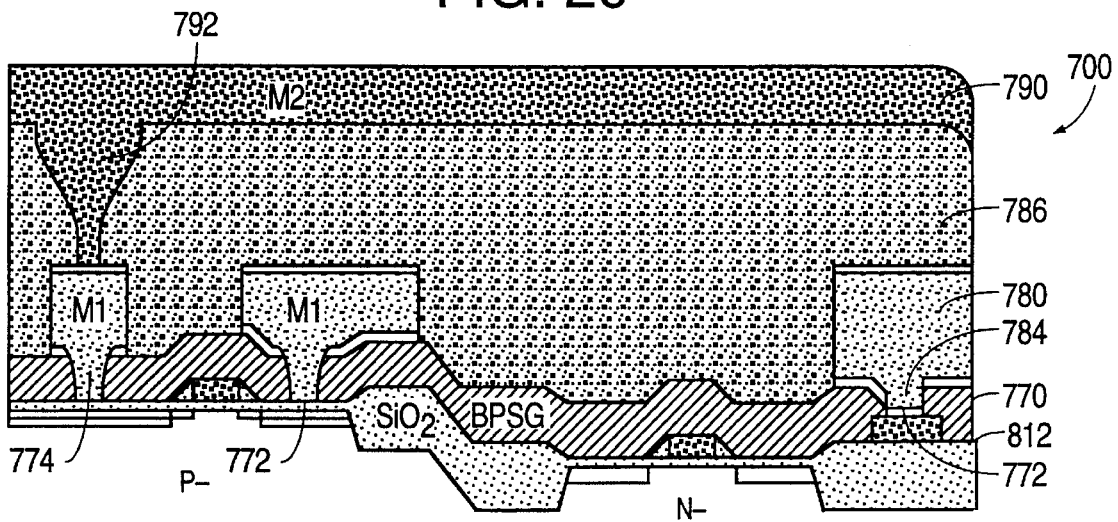
Figure 22:
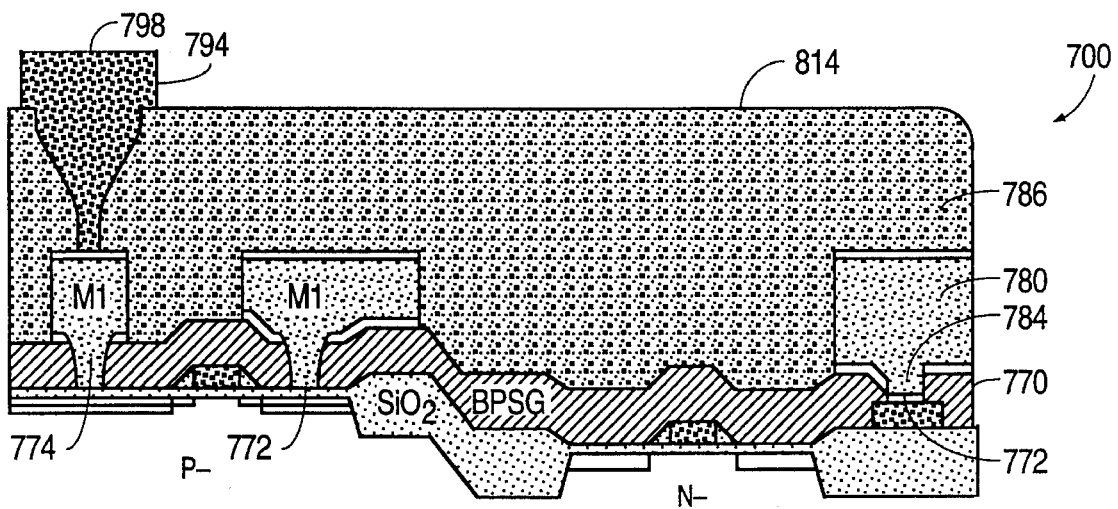

Referring to FIG. 20, a process for creating an interconnect via 788, which is shown in FIGS. 21 and 22, is illustrated. Dielectric layer 786 is patterned and deeply etched to form a via 788 using conventional photoresist operations in accordance with a predesigned via mask (not shown). A via 788 is formed to furnish a conduit for creating an electrical connection between the first metal layer 780 and the second metal layer 790 in a manner determined by the via mask and by selective forming of the second metal layer 790.

At this stage of the ROM 100 fabrication process, which uses conventional CMOS fabrication techniques, ROM memory arrays 700 are not yet programmed. All N-channel transistors 310 in memory cells 210 of a ROM memory array 122 or 142 are produced but not programmed. In this manner ROMs 100, which are ultimately used for a variety of different purposes and are thus programmed differently, are fabricated using conventional techniques to form identical non-programmed ROMs 100. Various ROMs 100 having substantially different programming and functionality are made available with no requirement for separate inventory controls and separate identification of each fabrication lot. Thus, an inventory of wafers which are finished up through and including via patterning may be maintained for quick response to custom orders for chips having a particular ROM coding.

Referring to FIG. 21, the second metal layer 790 is formed overlying the dielectric layer 786 by sputtering a thin film of aluminum over the entire frontside surface 812 of the substrate wafer 702. As is shown in FIG. 22, second metal layer 790 interconnections 794 form a metal polygon 798 and other structures (not shown) using a photoresist mask and etch process sequence. The interconnections 794 and metal polygon 798 are formed in a manner that produces a particular ROM array programming. The second metal layer 790 interconnections 794 form the address lines, which are also called word-lines, of the ROM array. Second metal layer 790 also forms ground reference lines, VSS lines of the ROM array, and metal strips that connect the gates of the ROM array memory cell N-channel transistors to either the VSS lines or word-lines, in accordance with desired programming of the ROM. A frontside surface 814 of the ROM 100 is coated with a dielectrical layer (not shown) which protects the wafer from water penetration or other contamination, and which prevents damage to the second metal layer 790.

While the invention has been described with reference to various embodiments, it will be understood that these embodiments are illustrative and that the scope of the invention is not limited to them. Variations, modifications, additions and improvements of the embodiments described are possible. For example, other sizes and configurations of ROM memory, as well as ROMs which incorporate various other types of driving, communication and other circuits in combination with a ROM memory array, are clearly contemplated to fall within the scope of the invention.

Furthermore, the illustrative two-metal CMOS process may be varied in numerous ways. For example, ion implantation steps may be achieved in different manners and using different implanted ions. Similarly, the thicknesses of various layers and dimensions of structures may take a wide range of values. These and other variations, modifications, additions and improvements may fall within the scope of the invention as defined in the claims which follow.

I claim:

1. A method of interconnecting an array of transistors in a CMOS read only memory, comprising the steps of:

forming a plurality of bit-lines in a first metal layer overlying a substrate containing the array of transistors, the bit-lines being coupled to drain regions of the transistors;

forming a dielectric insulating layer over the substrate and the bit-lines, the dielectric insulating layer being perforated by a plurality of vias for coupling to the first metal layer;

forming a plurality of word-lines and a plurality of reference voltage lines in a second metal layer overlying the dielectric insulating layer, the reference voltage being coupled to source regions of the transistors;

programming the plurality of transistors by selectively coupling either a word-line or a reference voltage line to the gate of a transistor.

2. A method according to claim 1 further comprising the step of:

subsequent to the word-line and reference voltage line forming step and precedent to the programming step, storing and handling the ROM awaiting a programming specification.

3. A method according to claim 1 wherein the reference voltage line is a ground line.

4. A method as in claim 1 wherein the bit-line forming step comprises the steps of:

depositing a layer of borophosphosilicate glass (BPSG) on a substrate containing the array of transistors;

planarizing the BPSG layer in a BPSG reflow operation;

patterning the BPSG layer to expose contact areas for metal-to-silicon contacts between the first metal layer and drain regions of the transistors;

sputtering a thin film of aluminum over the patterned BPSG layer; and patterning the thin film of aluminum to form the bit-lines that are coupled to the transistor drain regions.

5. A method as in claim 1 wherein the insulating layer forming step comprises the steps of:

forming a LTO—$SiO_2$ dielectric layer to a thickness in a range from 1000 Å to 3000 Å.

6. A method as in claim 1 wherein the word-line and reference voltage line forming step comprises the steps of:

sputtering a thin film of aluminum over the dielectric insulating layer;

patterning the thin film of aluminum to form the word-lines and reference voltage lines and to programmably couple either the word-line or the reference voltage line to the gate of a transistor for the plurality of transistors.

* * * * *